(12) United States Patent
Casper et al.

(10) Patent No.: US 6,542,098 B1
(45) Date of Patent: Apr. 1, 2003

(54) LOW-OUTPUT CAPACITANCE, CURRENT MODE DIGITAL-TO-ANALOG CONVERTER

(75) Inventors: Bryan K. Casper, Hillsboro, OR (US); James E. Jaussi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/965,149

(22) Filed: Sep. 26, 2001

(51) Int. Cl.[7] .................................................. H03M 1/66

(52) U.S. Cl. ...................... 341/144; 345/118; 345/120; 345/134; 345/135

(58) Field of Search ................................ 341/144, 145, 341/117, 118, 119, 120, 135, 134, 136, 121

(56) References Cited

U.S. PATENT DOCUMENTS

| | | | | |
|---|---|---|---|---|
| 5,252,910 A | * | 10/1993 | Agaesse | 323/315 |
| 5,475,339 A | * | 12/1995 | Maida | 327/561 |
| 5,512,815 A | * | 4/1996 | Schrader | 323/315 |
| 5,870,049 A | * | 2/1999 | Huang et al. | 341/144 |
| 6,006,169 A | * | 12/1999 | Sandhu et al. | 702/132 |
| 6,249,236 B1 | * | 6/2001 | Lee et al. | 341/143 |
| 6,295,233 B1 | * | 9/2001 | Kim et al. | 365/189.11 |
| 6,297,685 B1 | * | 10/2001 | Ewen et al. | 327/513 |
| 2002/0033729 A1 | * | 3/2002 | Lee et al. | 327/337 |

* cited by examiner

Primary Examiner—Brian Young
Assistant Examiner—John Nguyen
(74) Attorney, Agent, or Firm—Seth Z. Kalson

(57) ABSTRACT

A low output capacitance, current mode digital-to-analog converter. A low output capacitance is achieved by the use of a current mirror coupled to a plurality of digitally controlled current sources.

7 Claims, 4 Drawing Sheets

LOW-OUTPUT CAPACITANCE, CURRENT MODE DIGITAL-TO-ANALOG CONVERTER

FIELD

Embodiments of the present invention relate to circuits, and more particularly, to digital-to-analog converters.

BACKGROUND

Digitally controlled current sources, or current sinks, are used in many types of circuits. An example of a digitally controlled current sink, 101, is shown in FIG. 1, comprising port (or node) 102 for receiving a bias voltage $V_{bias}$, port (or node) 104 for receiving a digital signal d, and port (or node) 106 in which a current $I_{out}$ is sunk. When port 104 is HIGH, nMOSFET (n Metal Oxide Semiconductor Field Effect Transistor) 112 is OFF and nMOSFET 108 is ON, so that the gate of nMOSFET 110 is at the bias voltage $V_{bias}$ in order to sink current $I_{out}$. When port 104 is LOW, nMOSFET 108 is OFF and nMOSFET 112 is ON so that nMOSFET 110 is OFF and no current is sunk.

For convenience, throughout these letters patent, the term "current source" is meant to include either a circuit that sources a current, a circuit that sinks a current, or both. Similarly, although a current source may source current and a current sink may sink current, for convenience both functions will be referred to as sourcing a current. It will be clear from context, such as a circuit drawing, whether a current is sourced or sunk. Consequently, the circuit of FIG. 1 may be referred to as a current source, where current $I_{out}$ is sourced at port or node 106.

A current mode digital-to-analog (D/A) converter may employ a plurality of digitally controlled current sources to convert a digital signal to an analog signal. These current sources may be connected in parallel. For example, in FIG. 2 n digitally controlled current sources are connected in parallel to node 202, which is connected to network 204. For each i=0, 1, . . . , n−1, the digitally controlled current source indexed by i sources a current $I_i$. An output signal may be taken at node 202. For example, if network 204 is a simple resistor connected to a voltage source, the voltage at node 202 is an analog signal indicative of the digital signals controlling the digitally controlled current sources.

Other circuit functions may be realized by the high level functional diagram of FIG. 2 depending upon network 204. In general, network 204 represents a sub-circuit, and may comprise active elements as well as passive elements. For example, network 204 may be a differential amplifier in which the current sourced at node 202 provides biasing current to adjust the amplifier gain, where the gain is controlled by the digital signals controlling the digitally controlled current sources.

Some applications may require a relatively large number of parallel connected digitally controlled current sources. For example, a current mode D/A according to the circuit of FIG. 2 converter with a resolution of N bits uses $2^N$ digitally controlled current sources. A large number of current sources connected in parallel to a node may lead to the node having a large capacitance, which may slow down the speed of the circuit.

DESCRIPTION OF EMBODIMENTS

Figure 1:
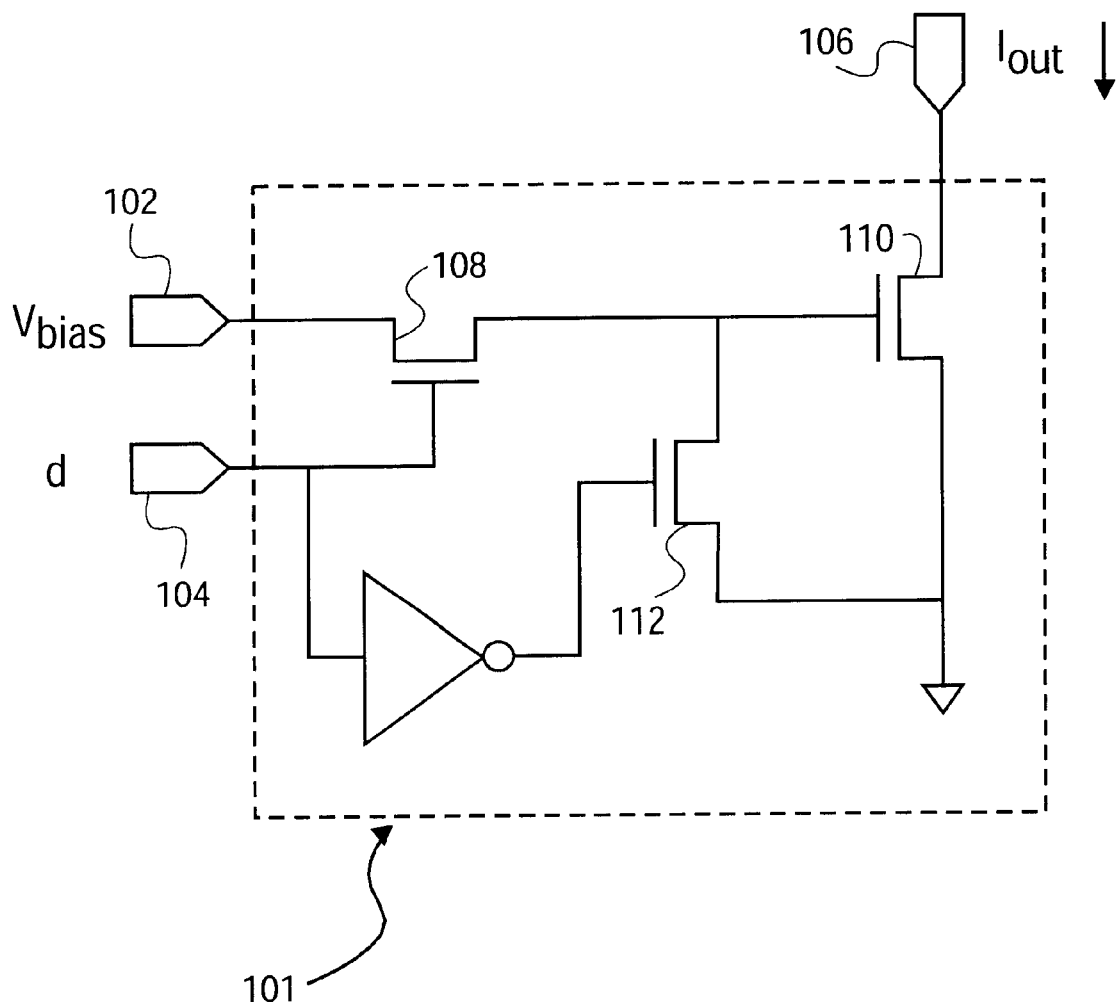
FIG. 1 is a prior art digitally controlled current source.
Figure 2:
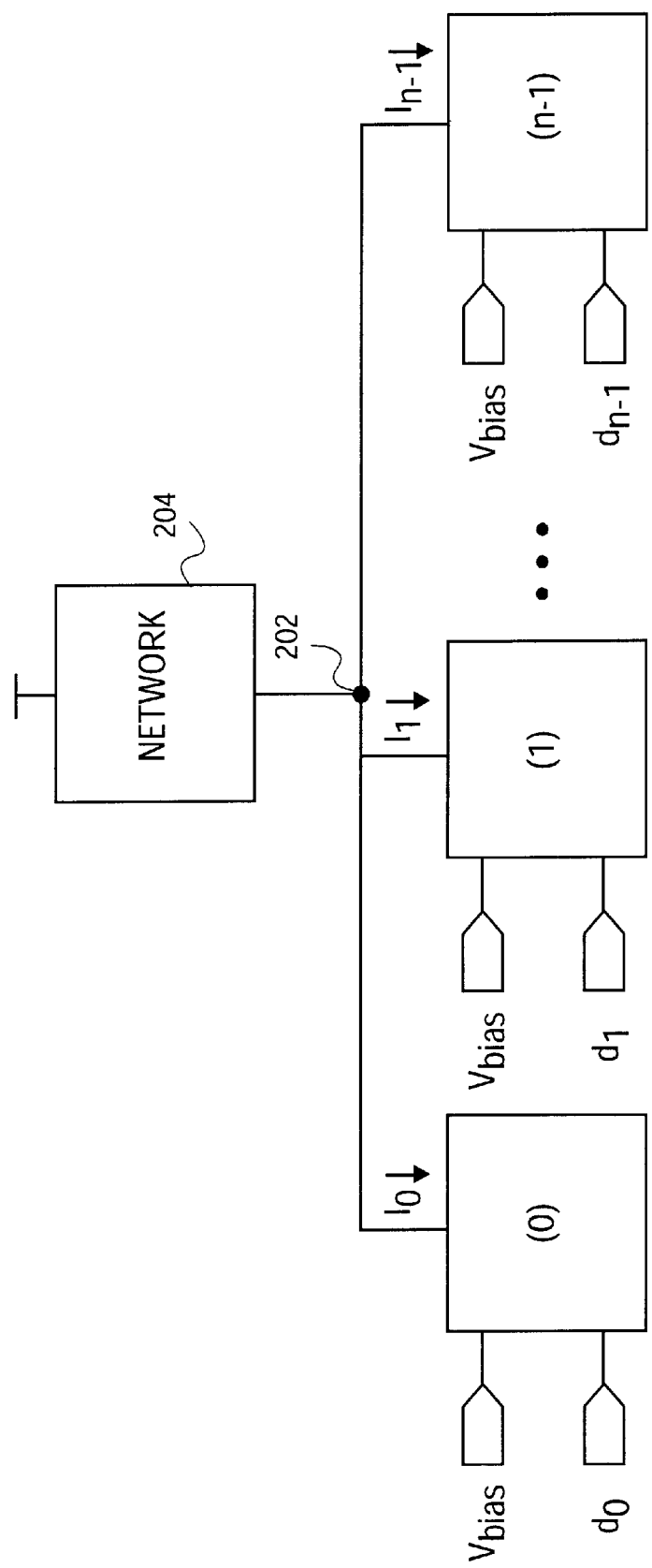
FIG. 2 is a prior art circuit employing digitally controlled current sources.
Figure 3:
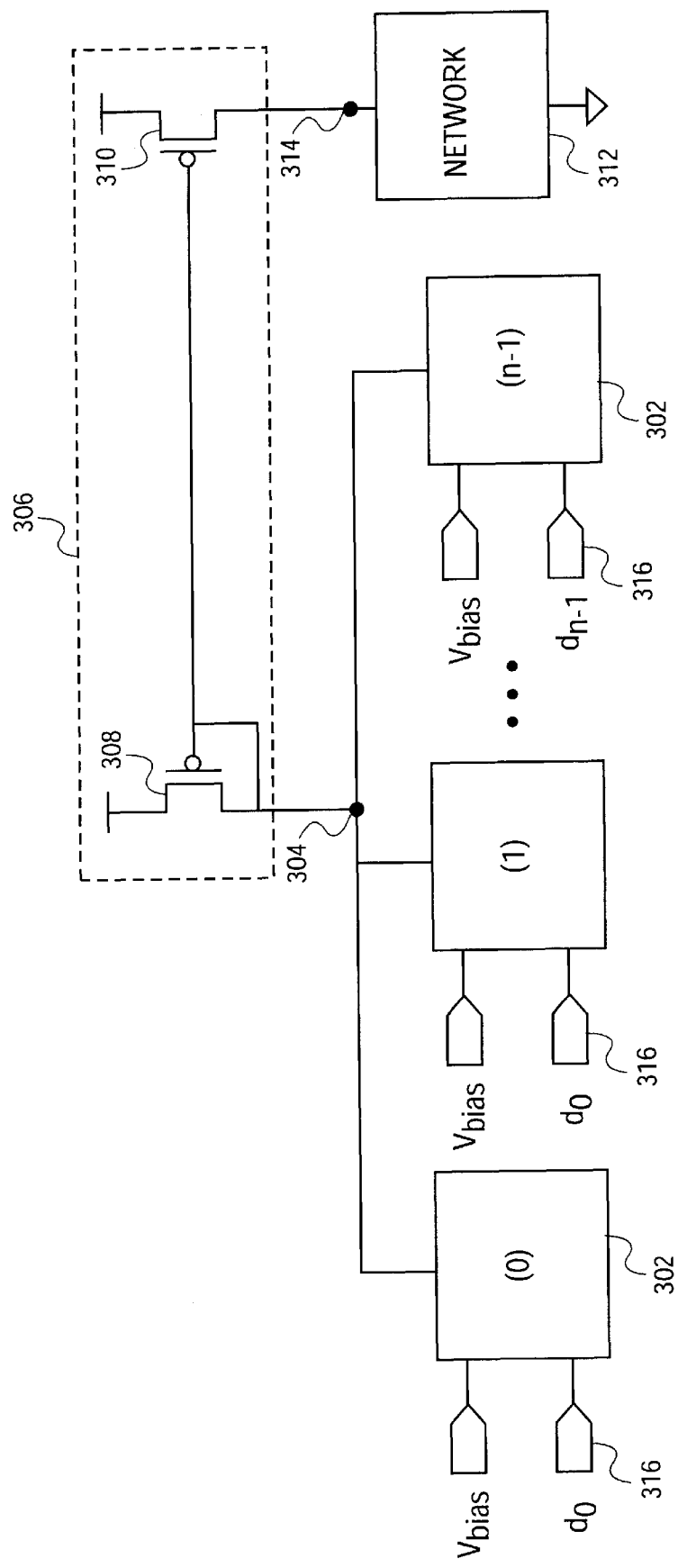
FIG. 3 is an embodiment according to the present invention.

An embodiment of the present invention is shown in FIG. 3, where n digitally controlled current sources 302 are connected in parallel to node 304 so that the currents sourced by each current source are additive in nature. The total current sourced at node 304 is mirrored by current mirror 306. Current mirror 306 comprises pMOSFET 308 and 310, where the gate of pMOSFET 308 is connected to its drain so as to be in saturation, and the gate of pMOSFET 308 is connected to the gate of pMOSFET 310. It is not necessary that current mirror 306 provide an actual mirror image in the sense that the current sourced to network 312 is equal in magnitude to the current sourced at node 304, but in general the current sourced to network 312 may have a magnitude proportional to the magnitude of the current sourced at node 304.

By providing current mirror 306, the capacitance at node 314 as seen by network 312 may be made significantly less than the capacitance at node 304. Consequently, the speed may be significantly increased over that of the prior art. Network 312 represents a generic sub-circuit connected to node 314, where different functions may be realized depending upon network 312. For example, as discussed earlier, network 312 may be a simple resistive device so that the voltage at node 314 is an analog signal indicative of the digital signals ($d_0$, . . . , $d_{n-1}$) applied to nodes 316. In that case, the speed of the resulting D/A converter is increased due to the use of current mirror 306.

Figure 4:
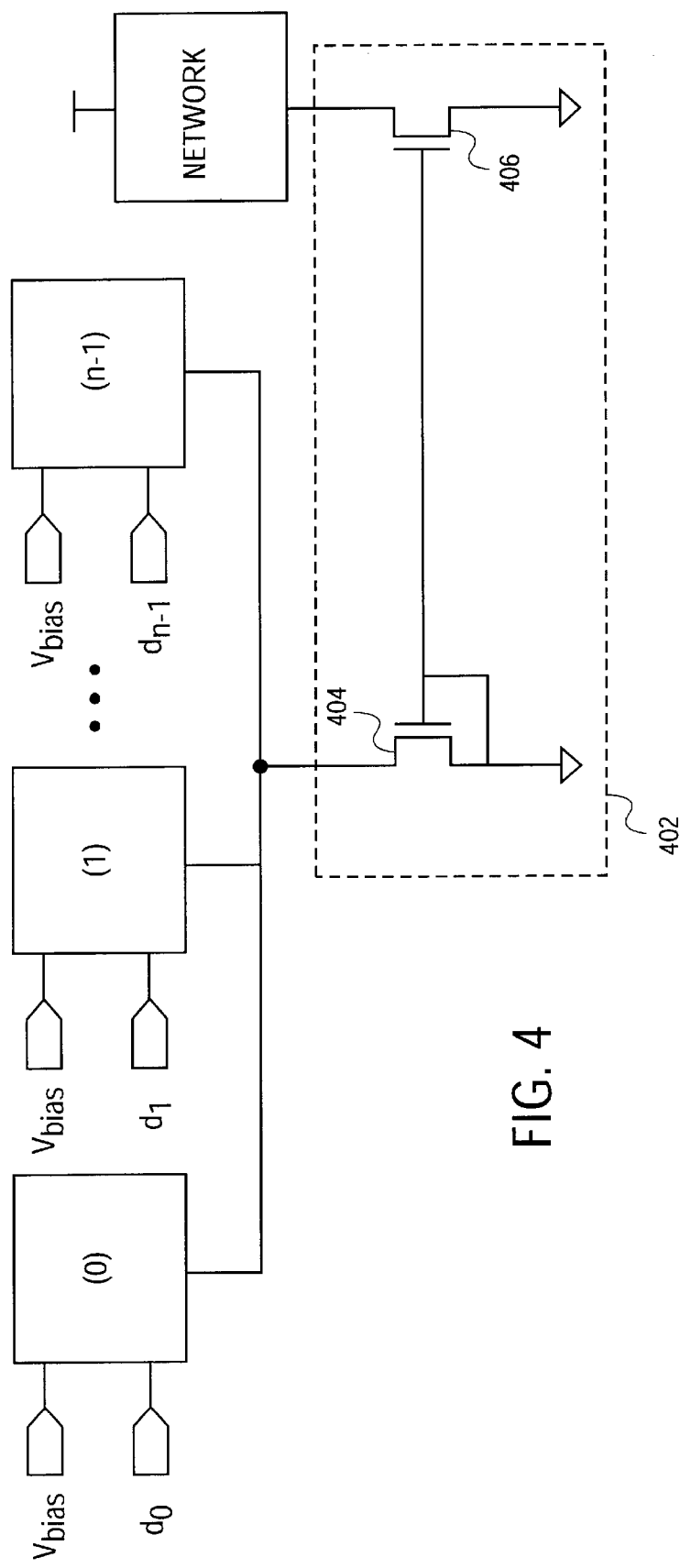
FIG. 4 is another embodiment according to the present invention.

An alternative embodiment is provided in FIG. 4, where current mirror 402 comprises nMOSFET 404 biased in saturation and nMOSFET 406 biased by nMOSFET 404. The operation of the circuit in FIG. 4 is similar to that of FIG. 3. Current miurrors may also be cascaded together to realize other embodiments. Furthermore, the current mirrors shown in FIGS. 3 and 4 are merely one particular kind. Many other types of current mirrors may be employed, such as for example, current mirrors with cascode connected transistors. Clearly, various modifications may be made to the disclosed embodiments without departing from the scope of the invention as claimed below.

What is claimed is:

1. A circuit comprising:
   a set of current sources, wherein each current source in the set of current sources has a port to source current and is digitally controlled by a respective digital control signal belonging to a set of digital control signals;
   a node connected to the port of each current source in the set of current sources;
   a current mirror connected to the node; and
   a sub-circuit connected to the current mirror to provide an analog signal indicative of the set of digital control signals.

2. The circuit as set forth in claim 1, wherein the node has a node capacitance and the current mirror has an output capacitance less than the node capacitance.

3. A circuit comprising:
   a set of current sources, each current source sourcing a current;

a node coupled to the set of current sources to source a summed current comprising a sum of the currents sourced by the set of current sources; and a current mirror coupled to the node to source a mirrored current proportional to the summed current, wherein the node has a node capacitance and the current mirror has an output capacitance less than the node capacitance.

4. The circuit as set forth in claim 3, wherein each current source is a digitally controlled current source responsive to a digital signal.

5. The circuit as set forth in claim 4, further comprising:

a sub-circuit coupled to the current mirror to provide a signal responsive to the digital signals.

6. The circuit as set forth in claim 3, further comprising:

a sub-circuit coupled to the current mirror to provide a signal responsive to the mirrored current.

7. A circuit comprising:

a set of current sources, each having a port to source a current;

a node connected to the port of each current source in the set of current sources, the node having a node capacitance; and a current mirror connected to the node and having an output capacitance less than the node capacitance.

* * * * *